United States Patent [19]

Kaufman

[11] Patent Number: 4,819,042
[45] Date of Patent: Apr. 4, 1989

[54] ISOLATED PACKAGE FOR MULTIPLE SEMICONDUCTOR POWER COMPONENTS

[76] Inventor: Lance R. Kaufman, 131 N. White Oak Way, Mequon, Wis. 53092

[21] Appl. No.: 546,996

[22] Filed: Oct. 31, 1983

[51] Int. Cl.$^4$ ............................................. H01L 27/12
[52] U.S. Cl. ..................................... 357/80; 361/386; 357/75
[58] Field of Search ....................... 357/72, 75, 76, 80; 361/386, 387, 388, 389; 174/52 PE

[56] References Cited

U.S. PATENT DOCUMENTS

| | | | |
|---|---|---|---|
| 3,697,814 | 10/1972 | Christman et al. | 357/76 |
| 3,825,767 | 7/1974 | Shields | 174/52 PE |
| 3,958,075 | 5/1976 | Kaufman | 174/16 HS |
| 4,038,678 | 10/1977 | Gottbreht et al. | 361/388 |
| 4,079,410 | 3/1978 | Schierz | 357/72 |
| 4,156,148 | 5/1979 | Kaufman | 250/551 |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,257,091 | 3/1981 | Kaufman | 363/85 |
| 4,266,140 | 5/1981 | Kaufman | 250/551 |
| 4,367,523 | 1/1983 | Urba | 361/387 |

FOREIGN PATENT DOCUMENTS

| | | | |
|---|---|---|---|
| 2840514 | 3/1979 | Fed. Rep. of Germany | 357/72 |
| 3211975 | 10/1982 | Fed. Rep. of Germany | 357/75 |
| 0110278 | 9/1976 | Japan | 357/76 |
| 0057960 | 5/1980 | Japan | 357/72 |
| 0021355 | 2/1981 | Japan | 357/76 |

Primary Examiner—James W. Davie
Assistant Examiner—V. Economou
Attorney, Agent, or Firm—Andrus, Sceales, Starke & Sawall

[57] ABSTRACT

Packaging structure is disclosed for three electrically isolated triacs (4,6,8) all within the same compact package (2). Plural sets of terminals are provided, each set having a pair of main terminals (15-16, 17-18, 19-20) and a gate terminal (39, 40, 41). One of the main terminals has a first substrate section (30, 31, 32) at a peripheral substrate edge (62) and a second substrate section (33, 34, 35) extending normally therefrom to an end portion (48, 49 50) disposed between substrate portions (42 and 24, 43 and 25, 44 and 26) of the gate terminal and the other main terminal, respectively. A power switching semiconductor component (4, 6, 8) is bonded to the end (48, 49, 50) of the extended substrate portion (33, 34, 35) of the one main terminal, which extended section has an open central section in which the gate terminal (39, 40, 41) is bonded to the substrate and isolated from the main terminals (15-16, 17-18, 19-20).

2 Claims, 2 Drawing Sheets

ISOLATED PACKAGE FOR MULTIPLE SEMICONDUCTOR POWER COMPONENTS

BACKGROUND AND SUMMARY

The invention relates to a circuit package for power semiconductor components. The invention enables a plurality of power semiconductors to be incorporated in the same package and electrically isolated from one another. In the disclosed embodiment three triacs are provided in a compact circuit package.

DETAILED DESCRIPTION

Figure 1:
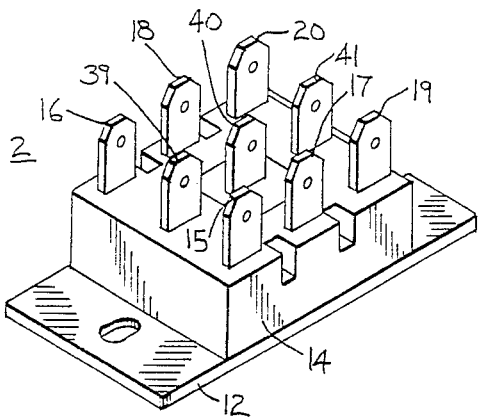
FIG. 1 is an isometric view of a circuit package constructed in accordance with the invention.
Figure 2:
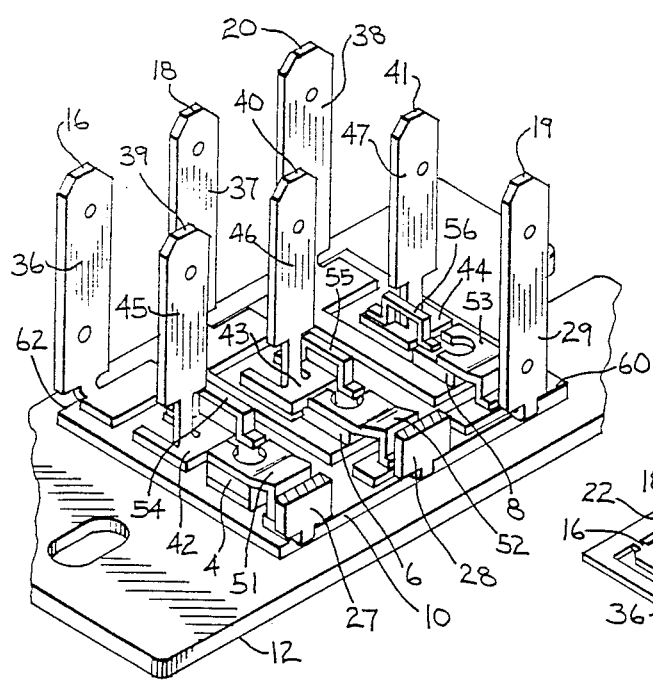
FIG. 2 is an isometric view of the package of FIG. 1 with the cover removed and some of the lead frames cut away.

There is shown in FIGS. 1 and 2 a compact circuit package 2 for up to three isolated power switching semiconductor components such as triacs 4, 6 and 8, each having a pair of main electrodes and a gate electrode for controlling conduction between the main electrodes. Package 2 includes an electrically insulating thermally conductive substrate 10, such as ceramic, bonded to a base plate 12 and covered by electrically insulating cover 14. Cover 14 has nine apertures in its top wall through which nine respective terminals extend, to be described. Base plate 12 is mounted to a heat sink or the like (not shown).

Figure 3:
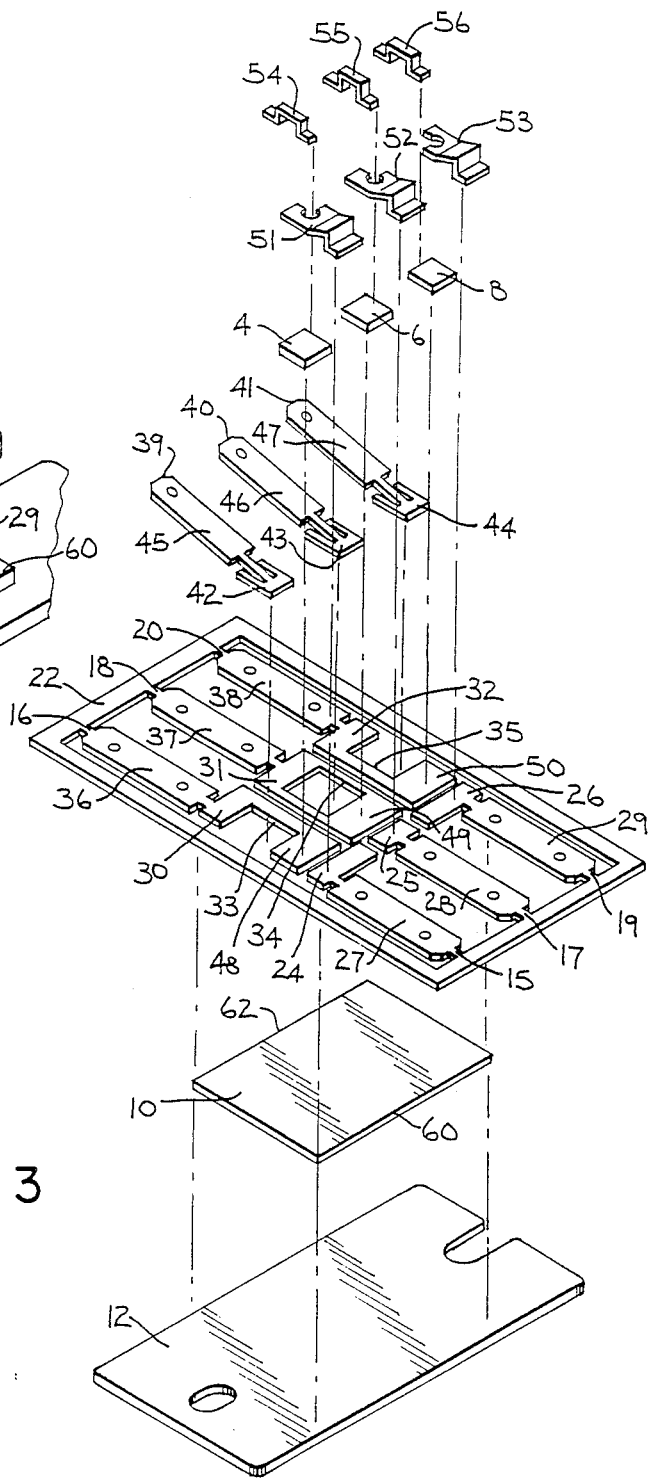
FIG. 3 is a pre-assembly exploded isometric view of the package of FIG. 2 before cutting and bending of the lead frames.

Referring to FIGS. 2 and 3, three pairs of main terminals 15 and 16, 17 and 18, and 19 and 20, are formed from a single unitary stamping 22 in a given pattern. The terminals of each pair are longitudinally aligned in stamping 22 and overlaid and bonded on substrate 10.

The first terminal of each pair has a bonding pad portion, such as 24, 25, and 26, for attachment to substrate 10. The first terminal of each pair also has an integral lead frame portion, such as 27, 28 and 29, bent away from substrate 10, FIG. 2. The second main terminal of each pair has a bonding pad portion, such as 30, 31 and 32, for attachment to substrate 10, with an open central section, such as 33, 34 and 35, exposing the substrate. The second main terminal of each pair also includes an integral lead frame portion, such as 36, 37, and 38, bent away from substrate 10, FIG. 2. Three gate terminals 39, 40 and 41 have respective pad portions, 42, 43 and 44, attached to respective exposed section of substrate 10 in the respective central open section of central bonding pad portions 33, 34 and 35 of respective second main terminals 16, 18 and 20. The three gate terminals 39, 40 and 41, also include respective integral lead frame portions, 45, 46 and 47, extending from substrate 10, FIG. 2.

The three power switching semiconductor components, triacs 4, 6, and 8, are bonded to the end portions 48, 49 and 50, of respective second main terminal bonding pad portions. Triacs 4, 6 and 8, are between the first main terminal bonding pad portions 24, 25 and 26, and the gate terminal bonding pad portions 42, 43 and 44. Each triac has one main electrode on its bottom surface and another main electrode on its top surface. The one main electrode on the bottom surface of each triac is thus connected to the respective second main terminal 16, 18, or 20. The other main electrode on the top of the triac is connected to the respective first main terminal 15, 17 or 19, by a respective jumper 51, 52 or 53, connected to respective first terminal bonding pad portion 24, 25 or 26. The gate electrode of each triac is also on the top surface and is connected to a respective gate terminal 39, 40 or 41, by a respective jumper 54, 55 or 56, connected to the respective gate terminal bonding pad portion 42, 43, or 44.

The lead frame stamping 22 is overlaid and bonded on substrate 10 at the noted attachment sections by a solder reflow process, or the like. The gate terminals, triacs, and jumpers are likewise bonded by a solder reflow process. After bonding, the outer peripheral frame of stamping 22 is cut away and the lead frames are bent upwardly away from the substrate, resulting in the assembly shown in FIG. 2.

As seen in FIG. 3, the second main terminal bonding pad portions 30 and 32 of the laterally outward pairs of main terminals have an open loop configuration as shown at 33 and 35. FIG. 3 shows a C-shaped configuration for this open loop. The respective laterally outward gate terminal bonding pad portions 42 and 44 are attached to substrate 10 in the middle of the C and electrically isolated from the second main terminal laterally outward bonding pad portions 30 and 32. The second main terminal bonding pad portion 31 of the central pair of main terminals in the stamping has a closed loop configuration, as shown by the O-shape at 34 in FIG. 3. The respective gate terminal bonding pad portion 43 is attached to substrate 10 within the O and electrically isolated from the second main terminal bonding pad portion 31. The laterally outward pairs of main terminals in stamping 22 thus have an identical but mirror image configuration and the central pair has a different configuration.

It is seen that there is provided a circuit package 2 for a plurality of electrically isolated power switching semiconductor components such as 4, 6, and 8, each having a pair of main electrodes and a gate electrode for controlling conduction between the main electrodes. A plurality of pairs of main terminals are formed from a single unitary stamping, in a given pattern, and overlaid and bonded on the substrate. A plurality of gate terminals are likewise bonded on the substrate. Each power switching semiconductor component is bonded to a respective one of the main terminals for connection to the respective main electrode, for example semiconductor component 4 is bonded to the second main terminal 16 of the first pair for connection to the bottom main electrode of semiconductor component 4. The other main electrode of each power switching semiconductor component is connected to the other main terminal by a jumper, for example the top main electrode of semiconductor component 4 is connected to the other main terminal 15 of the first pair by jumper 51. The gate electrode of each power switching semiconductor component is connected to the respective gate terminal by a jumper, for example the gate electrode on the top of semiconductor component 4 is connected to gate terminal 39 by jumper 54.

Each of the main terminals and gate terminals includes a substrate portion, such as 24, 25, 26, 30, 31, 32, 42, 43, and 44, extending along substrate 10. Each of the main terminals and the gate terminals also includes a lead frame portion, such as 27, 28, 29, 36, 37, 38, 45, 46 and 47, integral with the respective substrate portion and bent to extend away from substrate 10. Each pair of main terminals and its respective gate terminal forms a set. The lead frame portions 27, 28 and 29 of the first terminals of the sets extend generally from a first peripheral edge 60 of substrate 10. The lead frame portions 36, 37, and 38, of the second terminals of the sets extend generally from a second peripheral edge 62 of substrate 10 opposite first edge 60. Lead frame portions 45, 46 and 47, of third terminals of the sets extend from substrate 10 between the first and second opposing edges 60 and 62.

The substrate portions of the second terminals 16, 18 and 20, of the sets have first sections 30, 31 and 32, at the second peripheral edge 62, and second sections as shown at 33, 34 and 35, extending normal thereto and towards the first peripheral edge 60. Sections 33, 34, and 35 extend around and are isolated from the substrate portions 42, 43 and 44, of third terminals 39, 40 and 41, between peripheral edges 60 and 62. The substrate portions of the second terminals 16, 18 and 20, have an extended configuration with an open central section as shown at 33, 34 and 35, in which the respective third terminals 39, 40 and 41, are bonded to substrate 10 and isolated from second terminals 16, 18 and 20. The ends 48, 49 and 50, of the extended substrate portions of second terminals 16, 18 and 20, are disposed between the substrate portions of first terminals 15, 17 and 19, and third terminals 39, 40 and 41. The power switching semiconductor components 4, 6, and 8, are bonded to ends 48, 49 and 50, with the noted jumpers connecting the semiconductor components to the first and third terminals.

In FIG. 3, gate terminal bonding pad portion 42 has a fork-like E-shaped configuration, the two outer tines and the base of the E-shaped fork are bonded to substrate 10. The central tine is bent away from the substrate integrally with lead frame portion 45. The base and each outer tine of the E-shaped bonding pad portion 42 is within the central open section 33 of its respective bonding pad portion of its respective second main terminal 16. Gate terminal bonding pad portions 43 and 44 are comparable.

Figure 4:
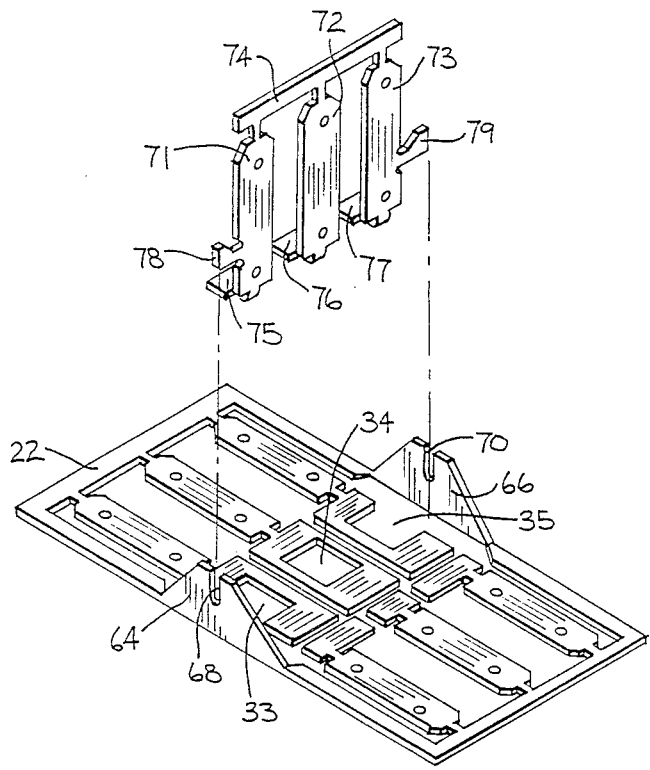
FIG. 4 is a view like FIG. 3 and shows an alternate embodiment.

FIG. 4 shows an alternate embodiment and like reference numerals are used where appropriate to facilitate clarity. Stamping 22 includes a pair of laterally outward ears 64 and 66 with slots 68 and 70. Ears 64 and 66 are bent upwardly from the plane of stamping 22. Gate terminals 71, 72 and 73 are formed from a single unitary stamping 74. Bonding pad portions 75, 76 and 77 are bent normally to the plane of stamping 74 and are bonded to the substrate in central open sections 33, 34 and 35. The laterally outward gate terminals 71 and 73 have outwardly extending arms 78 and 79 which rest in slots 68 and 70 to support stamping 74 during bonding operation. After bonding, arms 78 and 79, ears 64 and 66 and the peripheral frames of stampings 22 and 74, are cut away.

It is recognized that various modifications are possible within the scope of the apended claims.

I claim:

1. A circuit package for a plurality of isolated power switching semiconductor components each having a pair of main electrodes and a gate electrode for controlling conduction between the main electrodes, said package comprising:

an electrically insulating thermally conductive substrate;
a plurality of pairs of main terminals overlaid and bonded on said substrate;
a plurality of gate terminals bonded on said substrate;
each power switching semiconductor component being bonded to a respective ones of said main terminals for connection to the respective main electrode, the other main electrode being connected to the other main terminal by a jumper, and the gate electrode being connected to said gate terminal by an electrically conductive jumper strap extending therebetween, wherein:

each of said main terminals and gate terminals includes a substrate portion extending along said substrate, and a lead frame portion integral with said substrate portion and bent to extend away from said substrate;

each pair of main terminals and its respective gate terminal forms a set;

said lead frame portions of said first main terminals of said pair extend generally from a first peripheral edge of said substrate;

said lead frame portions of said second main terminals of said pair extend generally from a second peripheral edge of said substrate opposite said first edge;

said lead frame portions of third terminals of said sets extend from said substrate between said first and second opposing edges;

each said substrate portion of said second terminals of said sets has a first section at said second peripheral edge and a second section extending normal thereto and towards said first peripheral edge around and isolated from said substrate portion of said third terminal between said peripheral edges, said substrate portion of said second terminal having an extended configuration with an open central section in which said third terminal is bonded to said substrate and isolated from said second terminal;

the end of the extended substrate portion of said second terminal is disposed between the substrate portions of said first and third terminals wherein said power switching semiconductor component is bonded to said end of said extended substrate portion of said second terminal, said electrically conductive jumper straps connecting said semiconductor component to said first and third terminals, wherein each of said main terminals is bent along a bending line parallel to said first and second peripheral edges.

2. A circuit package for a plurality of electrically isolated power switching semiconductor components each having a pair of main electrodes and a gate electrode for controlling conduction between the main electrodes, said package comprising:

an electrically insulating thermally conductive substrate;

a plurality of pairs of main terminals overlaid and bonded on said substrate;

the first terminal of each pair having a bonding pad portion for attachment to said substrate and an integral lead frame portion bent away from said substrate;

the second main terminal of each pair having a bonding pad portion for attachment to said substrate with an open central section exposing said substrate, and an integral lead frame portion bent away from said substrate;

said lead frame portions of said first main terminals of said pairs extending generally from a first peripheral edge of said substrate;

said lead frame portions of said second main terminals of said pairs extending generally from a second peripheral edge of said substrate opposite said first edge;

a plurality of gate terminals each having a bonding pad portion attached to a respective said exposed section of said substrate in said central open section of said bonding pad portion of its respective said second main terminal, and including an integral lead frame portion extending from said substrate;

a plurality of power switching semiconductor components each bonded to the end portion of the respective said second main terminal bonding pad portion between said first main terminal bonding pad portion and said gate terminal bonding pad portion for connection to the respective main electrode, the other respective main electrode being connected to said first terminal bonding pad portion by an electrically conductive jumper strap extending therebetween, and the respective gate electrode being connected to said gate terminal bonding pad portion by another electrically conductive jumper strap extending therebetween, wherein:

laterally outward pairs of said main terminals have identical but mirror image configurations, and a central pair has a different configuration;

said second main terminal bonding pad portion of the laterally outward pairs of said main terminals have an open loop C-shaped configuration, and the respective said gate terminal bonding pad portions are attached to said substrate in the middle of said C and isolated from said second main terminal bonding pad portions;

said second main terminal bonding pad portion of a central pair of main terminals has a closed loop generally O-shaped configuration, and the respective gate terminal bonding pad portion is attached to said substrate within said O and isolated from said second main terminal bonding pad portion, wherein each of said main terminals is bent along a bending line parallel to said first and second peripheral edges.

* * * * *